(12) United States Patent
Ajoian et al.

(10) Patent No.: US 9,668,340 B1
(45) Date of Patent: May 30, 2017

(54) METHODS AND DEVICES FOR PREVENTING OVERHANGS IN A FINISHING LAYER OF METAL FORMED ON ELECTRICAL CONTACT SURFACES WHEN FABRICATING MULTI-LAYER PRINTED CIRCUIT BOARDS

(71) Applicant: Avago Technologies General IP (Singapore) Pte. Ltd., Singapore (SG)

(72) Inventors: Jack Ajoian, Campbell, CA (US); Lea-Teng Lee, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/139,122

(22) Filed: Apr. 26, 2016

(51) Int. Cl.
| | |
|---|---|
| *H05K 1/00* | (2006.01) |
| *H05K 1/02* | (2006.01) |
| *H05K 3/46* | (2006.01) |
| *H05K 3/18* | (2006.01) |
| *H05K 3/00* | (2006.01) |
| *H05K 1/09* | (2006.01) |
| *H05K 3/06* | (2006.01) |
| *H05K 1/11* | (2006.01) |

(52) U.S. Cl.
CPC ............ *H05K 1/0298* (2013.01); *H05K 1/09* (2013.01); *H05K 1/111* (2013.01); *H05K 3/0023* (2013.01); *H05K 3/0047* (2013.01); *H05K 3/06* (2013.01); *H05K 3/18* (2013.01); *H05K 3/465* (2013.01); *H05K 2203/06* (2013.01)

(58) Field of Classification Search
CPC ........ H05K 1/0298; H05K 1/09; H05K 1/111; H05K 3/0023; H05K 3/0047; H05K 3/06; H05K 3/18; H05K 3/465; H05K 2203/06
USPC ................................ 174/250, 251, 255–258
See application file for complete search history.

(56) References Cited

U.S. PATENT DOCUMENTS

| | | |
|---|---|---|
| 7,964,973 B2 | 6/2011 | Lin et al. |
| 8,242,012 B2 | 8/2012 | Daubenspeck et al. |
| 2014/0183747 A1 | 7/2014 | Samoilov et al. |

*Primary Examiner* — Tremesha S Willis

(57) ABSTRACT

A build-up process for fabricating a multi-layer PCB is provided that prevents, or at least reduces the lengths of, overhangs in the finishing metal layer that is plated onto the electrical contact metal layer. The metal seed layer is etched away prior to plating the finishing metal layer onto the electrical contact metal layer. The electrical contact metal layer is covered with a layer of dielectric material, which is then patterned to selectively expose preselected areas of the electrical contact metal layer. The exposed preselected areas of the electrical contact metal layer are then plated with the finishing layer of metal. The result is that overhangs are eliminated or at least greatly reduced in length. In addition, the dielectric material layer serves a function similar to that of a solder mask and obviates the need to apply the oxide to serve as a solder mask.

28 Claims, 7 Drawing Sheets

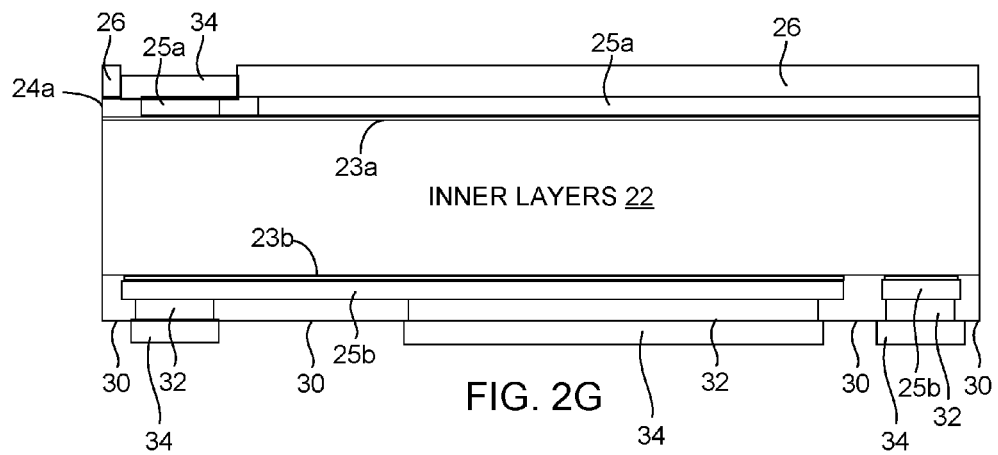
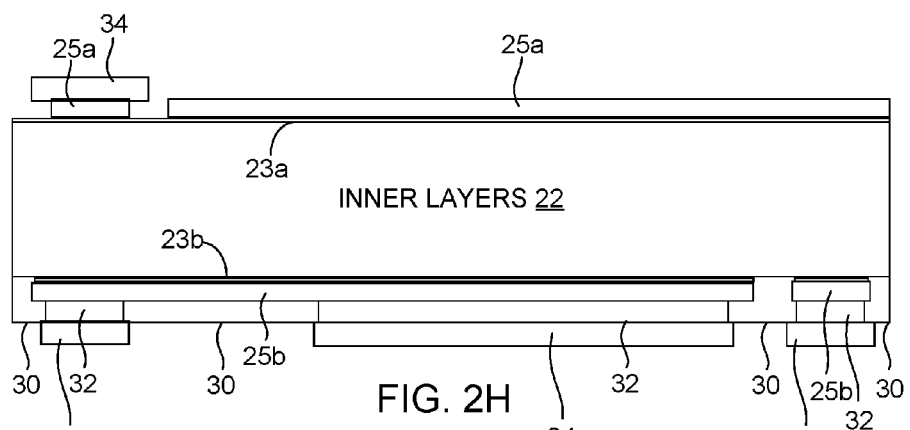
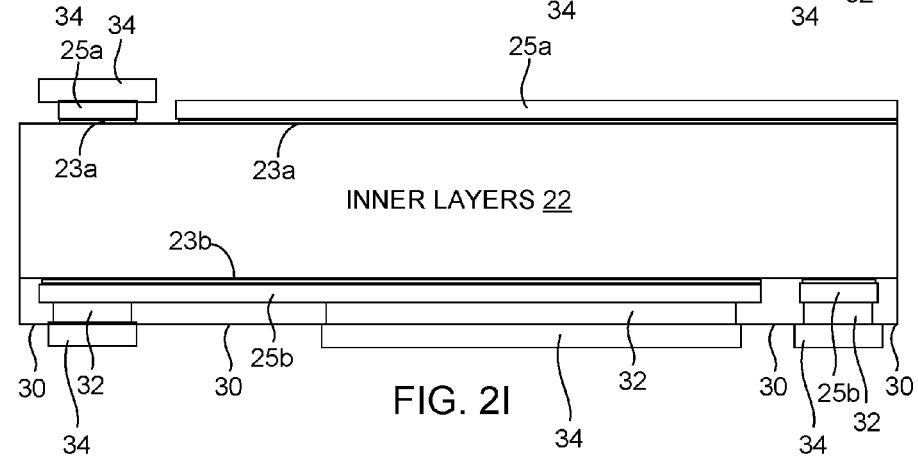

US 9,668,340 B1

METHODS AND DEVICES FOR PREVENTING OVERHANGS IN A FINISHING LAYER OF METAL FORMED ON ELECTRICAL CONTACT SURFACES WHEN FABRICATING MULTI-LAYER PRINTED CIRCUIT BOARDS

FIELD OF THE INVENTION

The invention relates to multi-layer printed circuit boards (PCBs), and more particularly, to preventing or reducing overhangs in a finishing layer of metal formed on electrical contact surfaces during the fabrication of multi-layer PCBs.

BACKGROUND

Multi-layer PCBs are used in a variety of electrical, electronic and optoelectronic applications for mounting and electrically interconnecting electrical, electronic and/or optoelectronic components. A typical multi-layer PCB comprises layers of organic dielectric substrate material, typically referred to as prepreg, having layers of metal embedded therein that are often patterned to provide electrical signal routing. The metal layers are often interconnected by electrically-conductive vias to allow the electrical signals to be routed vertically through multiple layers of the PCB.

A typical multi-layer PCB manufacturing process is a build-up process in which the layers are built one layer at a time. The build-up process typically comprises using dry dielectric film masking steps to selectively mask regions of a metal seed layer disposed on a starting structure, electroplating onto the unmasked regions of the metal seed layer to form a patterned metal layer, removing the dry dielectric film layer and the metal seed layer below it, laminating a layer of dielectric prepreg material on top of the patterned metal layer, drilling one or more via holes through the laminated dielectric prepreg, cleaning the via holes, forming a metal seed layer on the walls of the via holes, and electroplating metal onto the via holes and onto the non-masked areas of the seed layer to simultaneously fill the via holes with metal and form the patterned metal layer. The process is then repeated to form each additional PCB layer.

On one or both of the outer PCB layers, electrical contacts are formed by electroplating a layer of metal, typically copper, onto the metal seed layer. After the layer of copper has been plated onto the metal seed layer, a finishing layer of metal, which is often a layer of gold (Au) or Nickel-Gold (NiAu), is plated onto the top surfaces of the copper electrical contacts. The exposed portions of the metal seed layer are then etched away. During the process of etching away the metal seed layer, the side walls of the copper electrical contacts also experience etching, which can result in severe overhangs of the Au or NiAu. These overhangs can lead to electrical shorts, cosmetic defects, stringers, and foreign material defects.

FIGS. 1A-1G illustrate cross-sectional views of a multi-layer PCB during the aforementioned known fabrication process that results in overhangs. With reference to FIG. 1A, a PCB having a plurality of inner layers 2 has first and second metal seed layers 3a and 3b, respectively, disposed on opposite sides thereof. Each of the inner layers 2 typically is made up of a dielectric material layer (not shown) and a layer of metal that may be patterned or unpatterned. The dielectric material layer is typically made of "prepreg" that is laminated on top of the metal layer. In the PCB industry, the term "prepreg" denotes a reinforcing fabric made of woven composite fibers that is impregnated with a resin system (e.g., epoxy) that bonds the composite fibers together.

With reference to FIG. 1B, first and second dry dielectric film layers are deposited on top of the metal seed layers 3a and 3b, respectively, and patterned through selective exposure and development steps (photolithography) to form first and second dielectric masks 4a and 4b, respectively, on the first and second metal seed layers 3a and 3b, respectively. With reference to FIG. 1C, first and second layers of copper 5a and 5b, respectively, are then electroplated onto the unmasked areas of the metal seed layers 3a and 3b, respectively. With reference to FIG. 1D, third and fourth dry dielectric film layers are deposited on top of the first and second copper layers 5a and 5b, respectively, and patterned through selective exposure and development steps to form third and fourth dielectric masks 7a and 7b, respectively, on top of the first and second copper layers 5a and 5b, respectively. The copper layers 5a and 5b are the electrical contacts of the PCB.

With reference to FIG. 1E, after the third and fourth dielectric masks 7a and 7b, respectively, have been formed, a thin layer (a few micrometers) of finishing metal (e.g., Au or NiAu) is electroplated onto the unmasked areas of the copper layers 5a and 5b, respectively. With reference to FIG. 1F, the dielectric film layers 4a, 4b, 7a and 7b are stripped away. With reference to FIG. 1G, the exposed portions of the metal seed layer 3a and 3b are then etched away.

When the metal seed layers 3a, 3b are etched away, the etchant also etches away some of the copper layers 5a and 5b, including portions of the side walls of the copper layers 5a and 5b that form the electrical contacts. This can result in the aforementioned Au or NiAu overhangs 9 shown in FIG. 1G, which can lead to the aforementioned problems. In addition, because solder masks are not compatible with the electroplating processes described above, an oxide that serves a function similar to that of a solder mask is applied to the PCB. The oxide further etches the copper layers 5a and 5b, which can further increase the overhang lengths, exacerbating the aforementioned problems.

Accordingly, a need exists for a way to prevent the overhangs, or at least reduce their lengths, in order to prevent the aforementioned problems associated with overhangs.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale, emphasis instead being placed upon illustrating the principles of the invention. The drawings should not be interpreted as limiting the scope of the invention to the example embodiments shown herein.

FIGS. 2A-2I illustrate cross-sectional views of a multi-layer PCB during fabrication stages that are used to form the electrical contacts on one or both sides of the multi-layer PCB.

WRITTEN DESCRIPTION

Throughout this description, embodiments and variations are described for the purpose of illustrating uses and implementations of inventive concepts. The illustrative description should be understood as presenting examples of inventive concepts, rather than as limiting the scope of the concept as disclosed herein. It should be further understood that certain words and terms are used herein solely for convenience and such words and terms should be interpreted as referring to various objects and actions that are generally understood in various forms and equivalencies by persons of ordinary skill in the art. It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described.

In terms of a general overview, a build-up process for fabricating a multi-layer PCB is provided that prevents, or at least reduces the lengths of, overhangs in the finishing metal layer that is plated onto the copper electrical contact layer. The metal seed layer is etched away prior to plating the finishing metal layer onto the copper electrical contact layer. The copper electrical contact layer is covered with a layer of dielectric material, which is then patterned to selectively expose preselected areas of the copper electrical contact layer. The exposed preselected areas of the copper electrical contact layer are then plated with the finishing layer of metal. The result is that overhangs are eliminated or at least greatly reduced in length. In addition, the dielectric material layer serves a function similar to that of a solder mask and obviates the need to apply the aforementioned oxide to serve as a solder mask. As indicated above, application of the oxide during the known PCB fabrication process etches away some of the copper electrical contact layer, thereby further exacerbating the overhang problem.

The term "multi-layer PCB" or "multi-layer circuit board," as those terms are used herein, are intended to denote any multi-layer structure that is manufactured to include multiple layers of dielectric material and multiple layers of metal, at least some of which are patterned into signal routes or traces and at least some of which are interconnected by electrically-conductive vias. Thus, the terms "multi-layer PCB" and "multi-layer circuit board" denote, for example, typical multi-layer PCBs manufactured in the manner described above with reference to FIGS. 1A-1G, multi-layer printed wiring boards (PWBs), and multi-layer substrates. A few illustrative embodiments of the build-up process will now be described with reference to the figures.

Figure 1A:
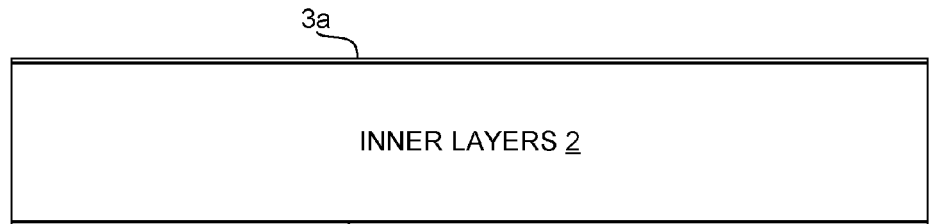
FIGS. 1A-1G illustrate cross-sectional views of a multi-layer PCB during the aforementioned known fabrication process that results in overhangs.
Figure 1B:
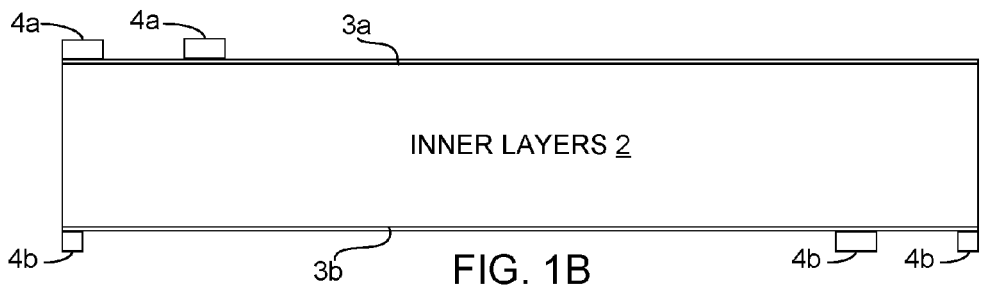
Figure 1C:
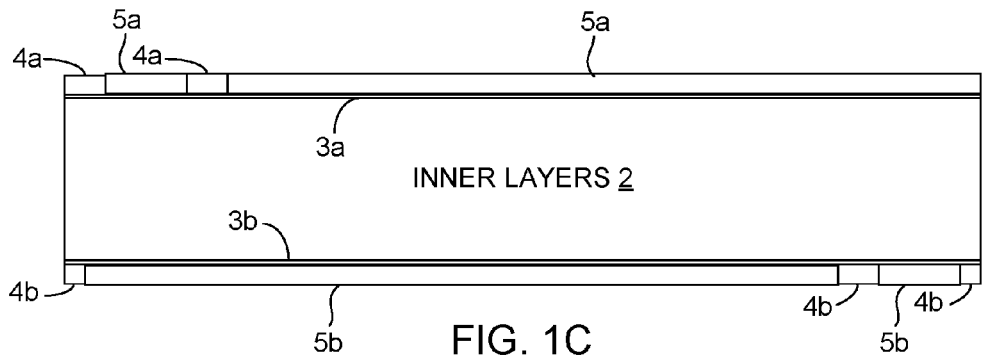
Figure 1D:
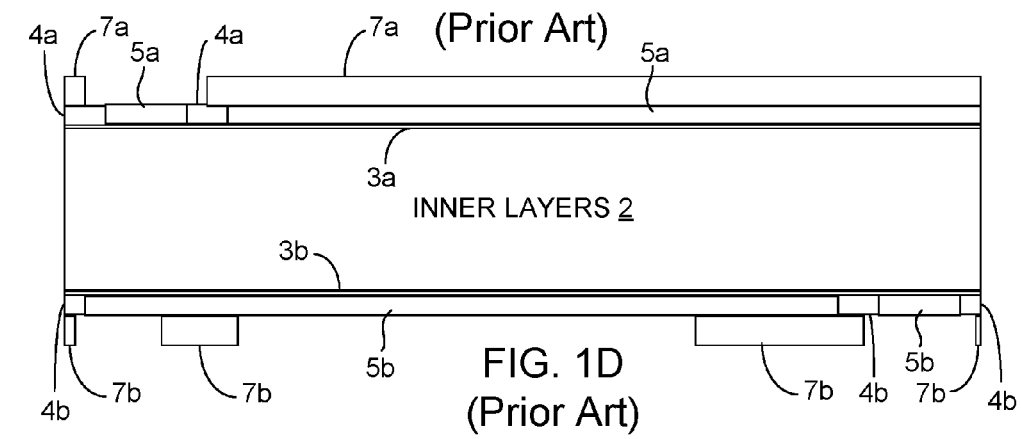
Figure 1E:
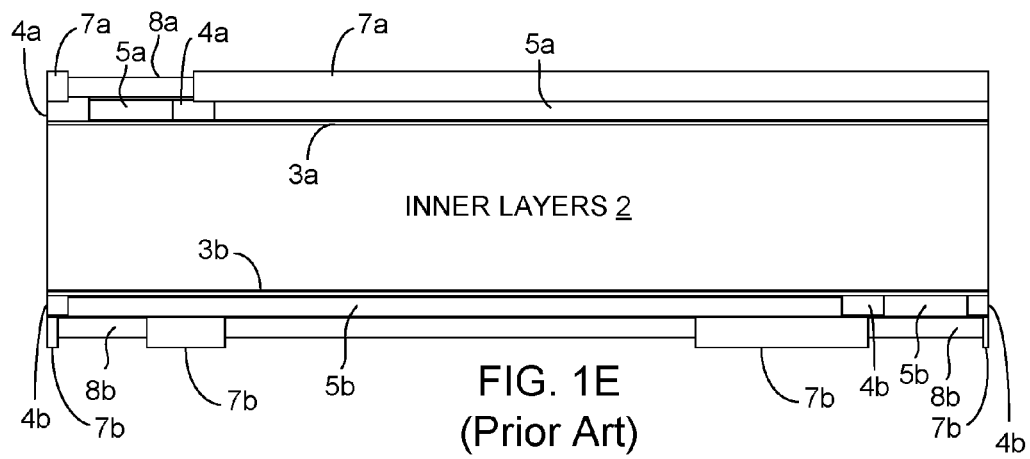
Figure 1F:
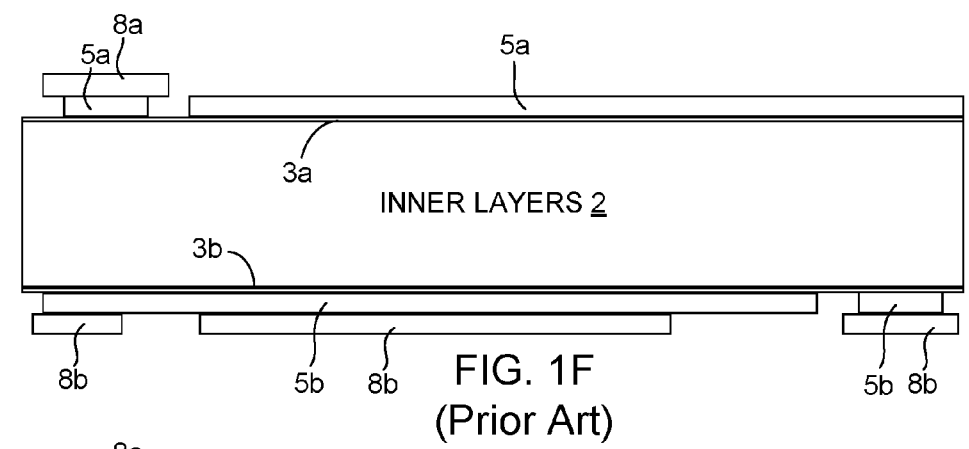
Figure 1G:
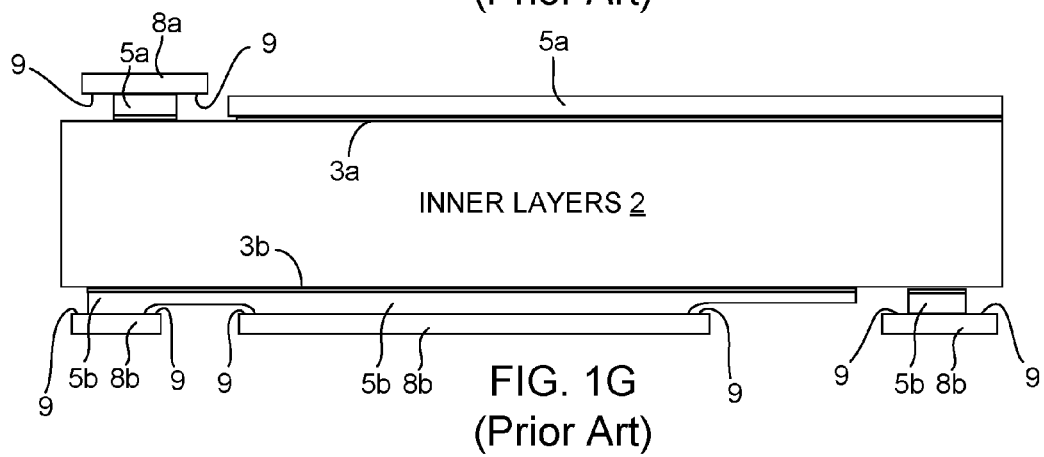
Figure 2A:
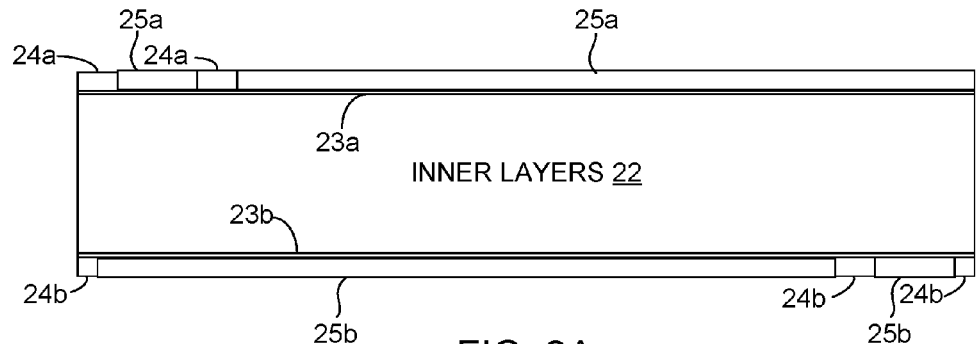

FIGS. 2A-2I illustrate cross-sectional views of a multi-layer PCB during fabrication stages that are used to form the electrical contacts on one or both sides of the multi-layer PCB. FIG. 2A shows the same stage of the fabrication process shown in FIG. 1C. Therefore, at the stage of the fabrication process shown in FIG. 2A, the processes described above with reference to FIGS. 1A-1C have already been performed. Features 22, 23a, 23b, 24a, 24b, 25a and 25b in FIG. 2A correspond to features 2, 3a, 3b, 4a, 4b, 5a, and 5b, respectively, shown in FIG. 1C.

Figure 2B:
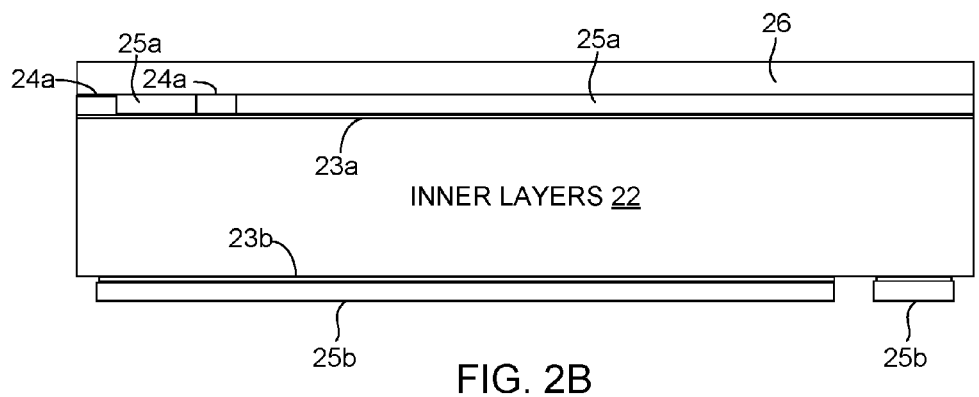

With reference to FIG. 2B, after the copper electrical contact layers 25a and 25b have been plated onto the metal seed layers 23a and 23b, respectively, the copper electrical contact layer 25a and the first dielectric material layer 24a are covered with a third dielectric dry film material layer 26 to protect layers 24a and 25a during subsequent processing of the opposite side of the PCB, as will now be described. The second dielectric material dry film layer 24b (FIG. 2A) is then stripped away to expose portions of the bottom metal seed layer 23b. The exposed portions of the bottom metal seed layer 23b are then etched away.

Figure 2C:
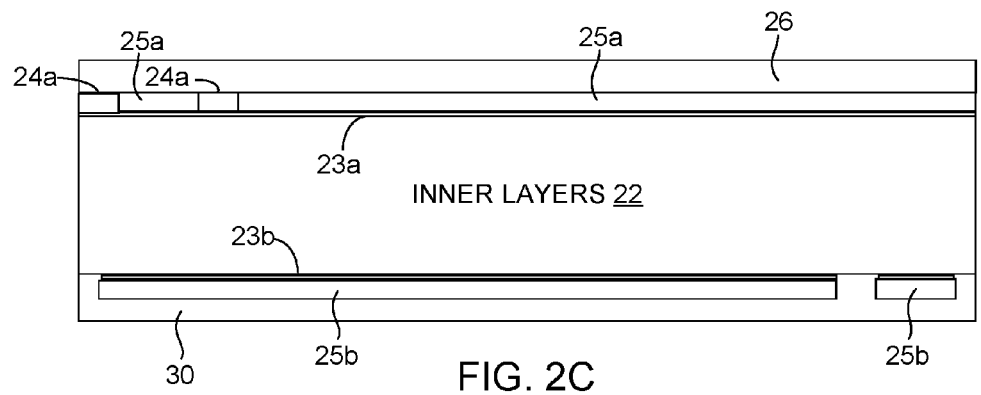

With reference to FIG. 2C, after the exposed portions of the bottom metal seed layer 23b have been etched away, the bottom copper electrical contact layer 25b is covered with a fourth dielectric material layer 30 that will later serve the same function as a solder mask, which, as indicated above, is not compatible with the electroplating processes. The fourth dielectric material layer 30 preferably is a photo-imageable dielectric (PID) laminate that is laminated onto the copper electrical contact layer 25b. The PID laminate is a product offered by a company called Taiyo Ink Manufacturing Company, Ltd., of Japan. The PID laminate has properties that make it well suited for use with PCB manufacturing processes, including good adhesion to metals, flowability such that the electrical contact metal layer 25b is immersed in it, good uniformity in that its top surface maintains uniformity, or planarity, across the width of the metal layer 25b, good dielectric characteristics, photo-imageable such that selected portions can be exposed to a particular wavelength of light and the unexposed portions are developed away to remove them without having to laser ablate, and compatibility with the range of temperatures used during the PCB manufacturing process. The term "photo-imageable dielectric" or "PID" material, as those terms are used herein, denote a dielectric material that is capable of being patterned by exposing selected portions of the material to a particular wavelength of light and then removing the exposed portions without the need for laser ablation or drilling. The process of exposing selected portions of the PID material 30 can be performed using a laser direct imaging (LDI) process, which is a known process that does not require masking.

Figure 2D:
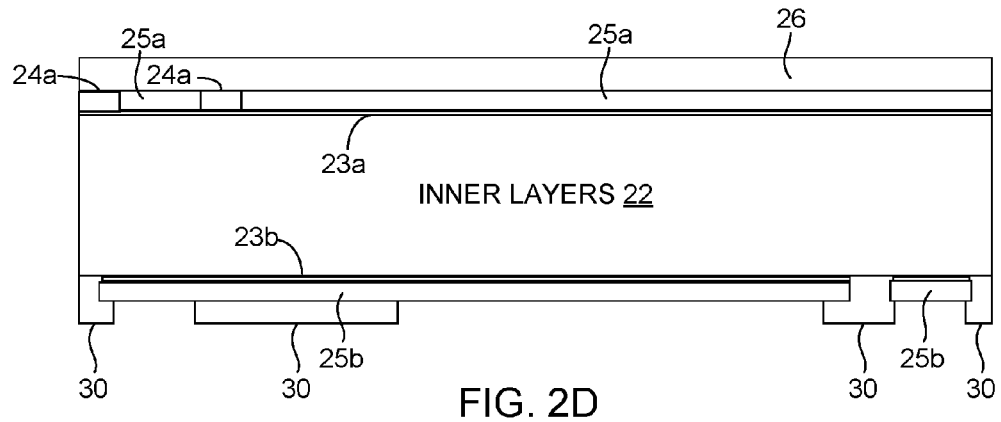

The PID laminate offered by Taiyo Ink Manufacturing Company, Ltd. comes with a copper foil backing, which is not shown in FIG. 2C because it is not important to this embodiment. With reference to FIG. 2D, after the copper electrical contact layer 25b has been covered with the dielectric material layer 30, preselected areas of the dielectric material layer 30 are removed. If the PID laminate is used as the dielectric material layer 30, the preselected areas are photo-imaged with electromagnetic radiation of a particular wavelength or wavelength range. After photo-imaging, the exposed areas of the PID laminate are developed away, leaving the patterned dielectric material layer 30 shown in FIG. 2D.

Figure 2E:
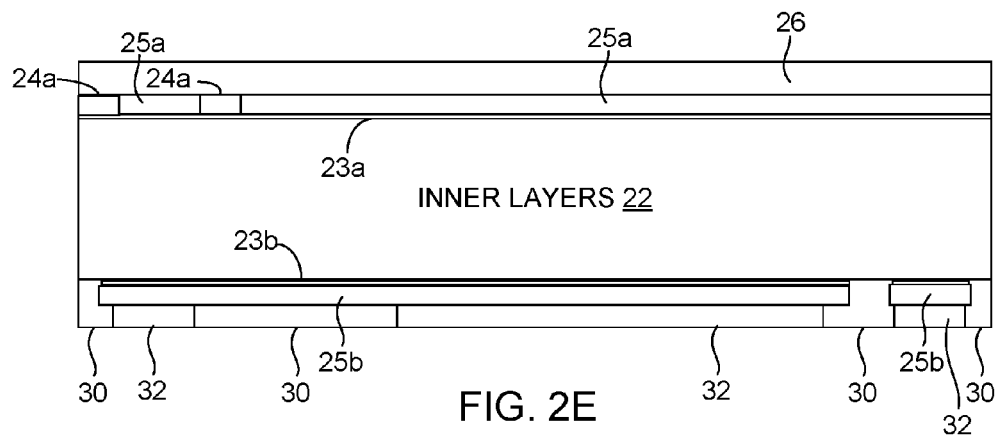

With reference to FIG. 2E, the patterned dielectric material layer 30 now serves as a mask to mask preselected areas of the bottom copper electrical contact layer 25b during formation of electrical contacts. A metal such as nickel or copper is electroplated onto the unmasked areas of the bottom copper electrical contact layer 25b to form electrical contacts 32 at preselected locations on the bottom of the PCB. Nickel works well for this purpose, if exposed beyond the bottom plane of patterned dielectric material layer 30, because it will not etch during the etching process that is subsequently used to etch away the top metal seed layer 23a.

Figure 2F:
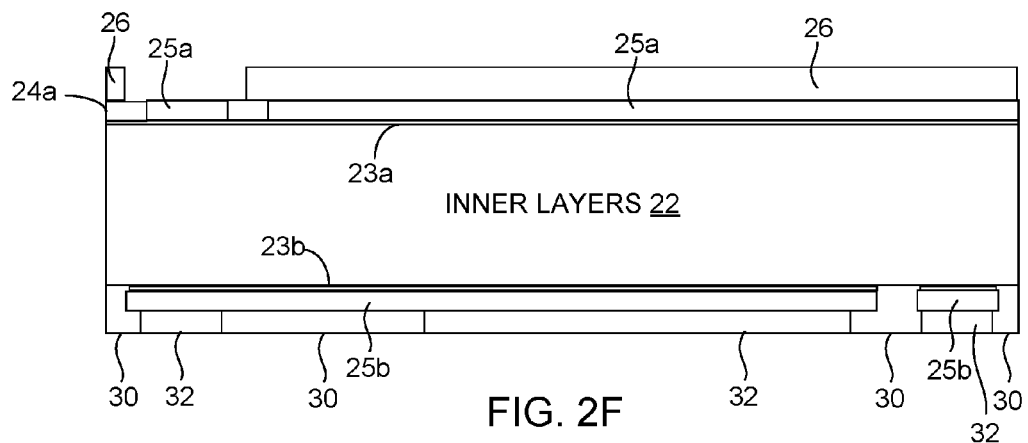

With reference to FIG. 2F, the top dielectric dry film material layer 26 is patterned through typical LDI photolithography, exposure and developing steps to mask preselected areas of the top copper electrical contact layer 25a. With reference to FIG. 2G, electroplating with a finishing metal such as Au or NiAu is then performed to plate the finishing metal 34 onto the exposed metal 25a and 32. With reference to FIG. 2H, the dielectric material layers 24a and 26 are then stripped away. With reference to FIG. 2I, the portions of the top metal seed layer 23a that were previously covered by the dielectric material layer 24a are then etched away leaving the PCB shown in FIG. 2I.

It can be seen from FIG. 2I that the problem of overhang of the finishing metal 34 on the bottom side of the PCB has been completely eliminated. Although there is still some overhang of the finishing metal 34 on the top side of the PCB, because the aforementioned oxide that increases the etch back is not used to provide solder mask functionality, the overhang is limited on the top side of the PCB. In addition, the top side of the PCB is typically over-molded, which prevents any overhang from breaking off during testing, shipment, or handling. The bottom side of the PCB is typically not over-molded because the customer needs to be able to access the bottom side to make electrical connections to the customer's motherboard. Therefore, it is more important to prevent overhangs on the bottom side, which is accomplished by this embodiment. If desired, the same process described above with reference to using the dielectric material layer 30 on the bottom side of the PCB could be performed on the top side of the PCB or on both sides of the PCB.

Although a PID material is preferably used as the dielectric material layer 30, other dielectric materials may be used for this purpose. Preferably the dielectric material that is used for this purpose is one that can be patterned without having to drill openings in the material. The PID material is useful in this regard because it can be patterned using the masking, photo-imaging and developing steps described above. However, wet-etchable dielectric materials also exist that are suitable for this purpose and that can be patterned with having to drill or laser ablate them.

Figure 3A:
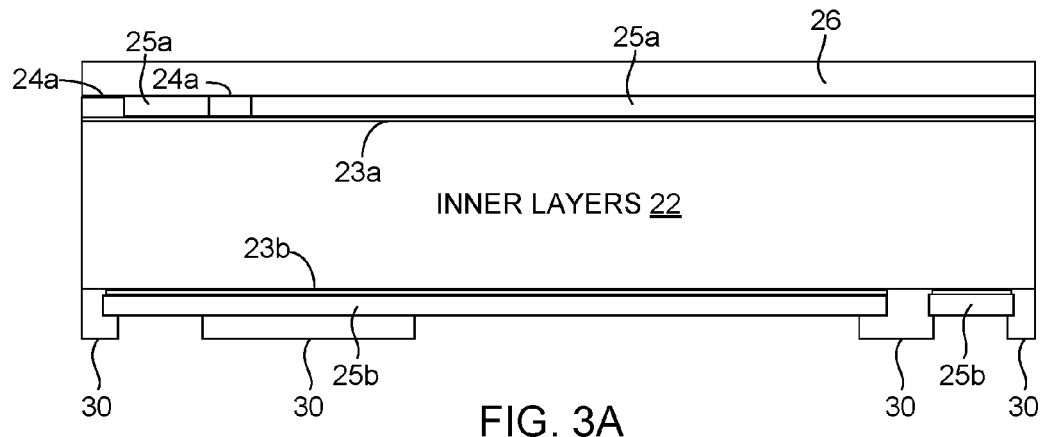
FIGS. 3A and 3B illustrate modifications to the fabrication process represented by FIGS. 2A-2I that are performed to create recessed finished electrical contacts that are not susceptible to overhang problems.
Figure 3B:
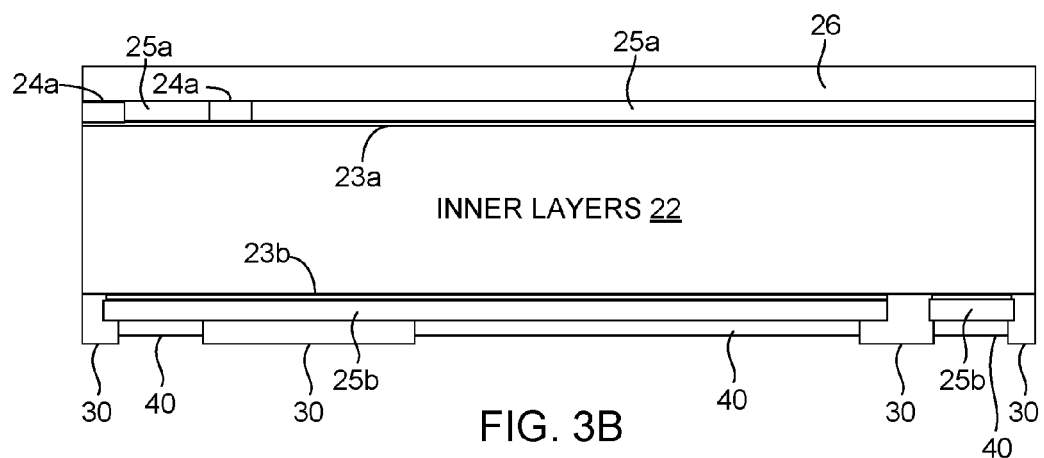

Many modifications can be made to the process described above with reference to FIGS. 2A-2I. For example, rather than adding the metal layer 32 in the step shown in FIG. 2E and then plating the finishing metal 34 on top of it as shown in FIGS. 2F and 2G, the finishing metal can be plated directly onto the copper electrical contact layer 25b. FIG. 3A is identical to FIG. 2D and is repeated for convenience. With reference to FIG. 3B, a finishing metal 40 (e.g., Au) is electroplated directly onto the bottom copper electrical contact layer 25b such that the finished electrical contacts are recessed relative to the lower surface of the dielectric material layer 30 and therefore are not susceptible to the overhang problem. As yet another alternative, with reference to FIG. 3C, the metal layer 32 can be electroplated onto the copper electrical contact layer 25b, but recessed relative to the lower surface of the dielectric material layer, and then a finishing metal 41 can be electroplated on top of metal layer 32 such that it is flush with the lower surface of the dielectric material layer 30 and therefore are not susceptible to the overhang problem.

Figure 3C:
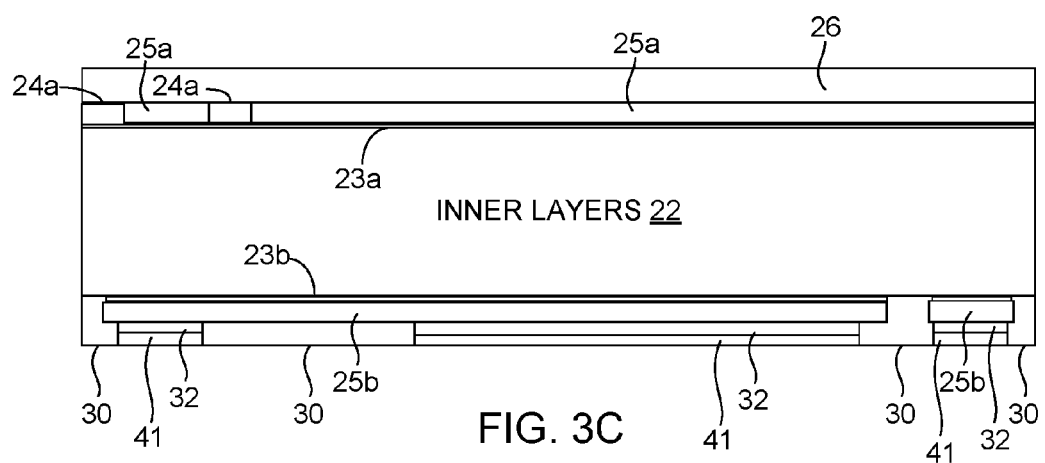
FIG. 3C illustrates a cross-sectional view of a multi-layer PCB having finished electrical contacts that are flush with a lower surface of a dielectric material layer so that the finished electrical contacts are not susceptible to overhang problems.

Therefore, the finished electrical contacts can be proud relative to the lower surface of the dielectric material layer 30, as depicted in FIG. 2I, recessed relative to the lower surface of the dielectric material layer 30, as depicted in FIG. 3B, or flush relative to the lower surface of the dielectric material layer 30, as depicted in FIG. 3C. In all cases, the overhang problem is eliminated.

As indicated above, the dielectric material layer 30 performs the same function as that of solder mask, which is not compatible with the electroplating processes used to make the PCB. By serving as a solder mask, the dielectric material layer 30 provides increasing mounting flexibility for mounting and electrically interconnecting components with the PCB, as will now be described with reference to FIG. 4.

Figure 4:
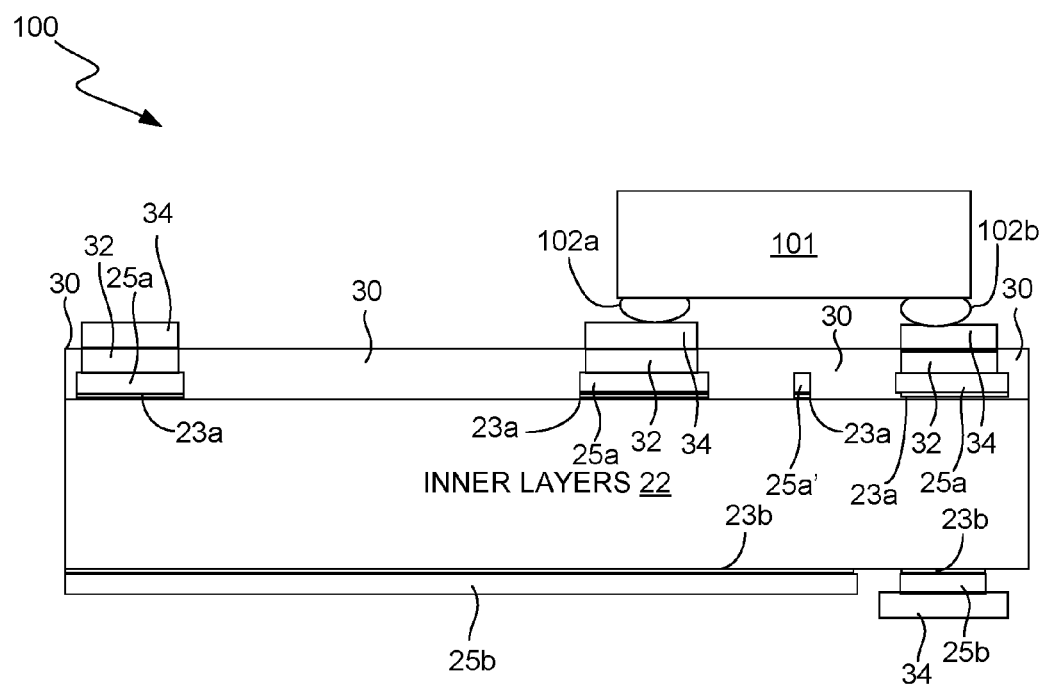
FIG. 4 illustrates a multi-layer PCB made by the process described above with reference to FIGS. 2A-2I in accordance with an illustrative embodiment that demonstrates the manner the process increases mounting flexibility for mounting components on the PCB.

FIG. 4 illustrates a multi-layer PCB 100 made by the process described above with reference to FIGS. 2A-2I in accordance with an illustrative embodiment in which the dielectric material 30 is used on the top side of the PCB 100 and the resulting finished electrical contact 34 is proud, but can be co-planar, of the top surface of the dielectric material layer 30. In FIG. 4, an electrical component 101 is shown mounted on the top side of the PCB 100 and electrically interconnected by solder bumps 102a and 102b to respective electrical contacts 32, 34 of the PCB 100. The copper electrical contact layer 25a is patterned and includes an electrically-conductive trace 25a' that is isolated between the electrical contacts 32, 34 that are connected to the solder bumps 102a and 102b. If the dielectric material layer 30 were not present, the mounting arrangement shown in FIG. 4 typically would not be allowed because of the danger that solder from solder bump 102a or 102b might bridge and electrically short the trace 25a' to some other electrical conductor. However, by serving the same function as a solder mask, the presence of the dielectric material layer 30 makes the mounting arrangement shown in FIG. 4 permissible. Therefore, the dielectric material layer 30 improves component mounting flexibility.

For the same reason, the dielectric material layer 30 allows the spacing between components on the PCB 100 to be much smaller than is currently allowed because the dielectric material layer 30 makes it virtually impossible that components mounted next to each other will electrically short to one another. Therefore, the dielectric material layer 30 allows more flexible assembly spacing rules to govern component-to-component spacing.

In summary, the use of the processes described above with reference to FIGS. 2A-3C and the dielectric material layer 30 simultaneously solve the overhang problem and achieve solder mask functionality where solder masks would otherwise not be used due to their incompatibility with electrolytic PCB fabrication processes. It should be noted that the invention has been described with reference to a few illustrative embodiments for the purpose of demonstrating principles and concepts of the invention. It will be understood by persons of skill in the art, in view of the description provided herein, that the invention is not limited to these illustrative embodiments. Persons of skill in the art will understand that many variations can be made to the illustrative embodiments without deviating from the scope of the invention.

What is claimed is:

1. A method for electrolytically forming a finishing layer of metal at preselected locations on top of a contact metal layer disposed on at least a first side of a circuit board, the method comprising:

forming a first dielectric film layer on top of a metal seed layer disposed on at least said first side of the circuit board;

patterning the first dielectric film layer to expose the metal seed layer at preselected locations thereof and to mask the metal seed layer at preselected locations thereof;

electrolytically forming a first contact metal layer on top of the exposed metal seed layer, wherein the first contact metal layer is not formed on the locations on the metal seed layer that are masked by the first dielectric film layer;

removing the patterned first dielectric film layer to expose previously-masked locations of the metal seed layer;

laminating a dielectric laminate over the first contact metal layer and over the exposed metal seed layer such that the dielectric laminate covers the first contact metal layer and the exposed metal seed layer;

curing the dielectric laminate;

removing preselected portions of the dielectric laminate to expose preselected locations of the first contact metal layer;

electrolytically forming a second contact metal layer on top of the exposed preselected locations of the first contact metal layer; and electrolytically forming the finishing layer of metal on top of the second contact metal layer.

2. The method of claim 1, wherein an outer surface of the second metal contact layer is flush with an outer surface of the dielectric laminate.

3. The method of claim 1, wherein the step of removing the preselected portions of the dielectric laminate comprises drilling openings through the preselected portions of the dielectric laminate to expose the preselected locations of the first metal contact layer.

4. The method of claim 1, wherein the dielectric laminate is a photo-imageable dielectric (PID) material, and wherein the step of removing the preselected portions of the dielectric laminate comprises:

exposing the preselected portions of the dielectric laminate material to light of a particular wavelength or wavelength range; and developing away the exposed preselected portions of the dielectric laminate material to expose the preselected locations of the first metal contact layer.

5. The method of claim 4, wherein the finishing layer of metal comprises gold.

6. The method of claim 5, wherein the first contact metal layer comprises copper.

7. The method of claim 6, wherein the second contact metal layer comprises nickel.

8. The method of claim 6, wherein the second contact metal layer comprises copper.

9. The method of claim 6, wherein the circuit board is a land grid array.

10. A method for electrolytically forming a finishing layer of metal at preselected locations on top of a contact metal layer disposed on at least a first side of a circuit board, the method comprising:

forming a first and second dielectric film layers on top of first and second metal seed layers, respectively, disposed on first and second sides, respectively, of the circuit board;

patterning the first and second dielectric film layers to expose the first and second metal seed layers, respectively, at preselected locations thereof and to mask the first and second metal seed layers, respectively, at preselected locations thereof;

electrolytically forming first and second contact metal layers on top of the exposed first and second metal seed layers, respectively;

forming a third dielectric film layer on top of the patterned second dielectric film layer and on top of the second contact metal layer;

removing the patterned first dielectric film layer to expose previously-masked locations of the first metal seed layer;

laminating a first dielectric laminate over the first contact metal layer and over the exposed first metal seed layer such that the first dielectric laminate covers the first contact metal layer and the exposed first metal seed layer;

curing the first dielectric laminate;

removing preselected portions of the first dielectric laminate to expose preselected locations of the first contact metal layer;

electrolytically forming a third contact metal layer on top of the exposed preselected locations of the first contact metal layer;

patterning the third dielectric film layer to expose preselected locations of the second contact metal layer;

electrolytically forming the finishing layer of metal on top of the first and third contact metal layers;

removing the patterned third dielectric film layer; and etching away the second metal seed layer.

11. The method of claim 10, wherein an outer surface of the third metal contact layer is flush with an outer surface of the first dielectric laminate.

12. The method of claim 10, wherein the step of removing the preselected portions of the first dielectric laminate comprises drilling openings through the preselected portions of the first dielectric laminate to expose the preselected locations of the first metal contact layer.

13. The method of claim 10, wherein the first dielectric laminate is a photo-imageable dielectric (PID) material, and wherein the step of removing the preselected portions of the first dielectric laminate comprises: exposing the preselected portions of the first dielectric laminate material to light of a particular wavelength or wavelength range; and developing away the exposed preselected portions of the first dielectric laminate material to expose the preselected locations of the first contact metal layer.

14. The method of claim 13, wherein the finishing layer of metal comprises gold.

15. The method of claim 14, wherein the first and second contact metal layers comprise copper.

16. The method of claim 15, wherein the third contact metal layer comprises nickel.

17. The method of claim 15, wherein the third contact metal layer comprises copper.

18. The method of claim 15, wherein the circuit board is a land grid array.

19. A circuit board comprising: on a first side of the circuit board, a first contact metal layer disposed at preselected locations on a first metal seed layer disposed on the first side of the circuit board, wherein the first metal seed layer only exists at the preselected locations; a first finishing layer of metal disposed on top of the first contact metal layer; on a second side of the circuit board, a second contact metal layer disposed at preselected locations on a second metal seed layer disposed on the second side of the circuit board; a first cured dielectric laminate masking preselected locations on the second contact metal layer; a third contact metal layer disposed on top of the second contact metal layer at locations on the second contact metal layer that are not masked by the first cured dielectric laminate; and a second finishing layer of metal disposed on top of the third contact metal layer.

20. The circuit board of claim 19, wherein the first cured dielectric laminate serves as a solder mask for subsequently mounting electrical, electronic or optoelectronic components on the second side and soldering electrical contacts of the components to the second finishing layer of metal disposed on top of the third contact metal layer.

21. The circuit board of claim 19, wherein the first cured dielectric laminate is a photo-imageable dielectric (PID) laminate.

22. The circuit board of claim 19, wherein the second finishing layer extends beyond an outer surface of the first cured dielectric laminate.

23. The circuit board of claim 19, wherein the second finishing layer is flush with an outer surface of the first cured dielectric laminate.

24. The circuit board of claim 19, wherein the second finishing layer is recessed within an outer surface of the first cured dielectric laminate.

25. The circuit board of claim 19, further comprising:
a first electrical, electronic or optoelectronic component mounted on the second side of the circuit board and having at least a first electrical contact disposed on a lower surface thereof that is electrically coupled with the second finishing layer of metal to electrically interconnect the first electrical, electronic or optoelectronic component with the circuit board.

26. The circuit board of claim 25, wherein the second finishing layer is exposed through the first cured dielectric laminate at a plurality of locations to form a first array of circuit board electrical contacts.

27. The circuit board of claim 26, wherein the first finishing layer of metal disposed on top of the first contact metal layer comprises a second array of circuit board electrical contacts, the second array of circuit board electrical contacts being configured as an electrical interface for electrically interfacing the circuit board with a mother circuit board.

28. The circuit board of claim 19, wherein the circuit board is a multi-layer circuit board comprising at least one layer of metal and at least one layer of dielectric material disposed in between the first and second sides of the circuit board.

* * * * *